US 9,385,186 B2

(12) United States Patent
Li

(10) Patent No.: US 9,385,186 B2
(45) Date of Patent: Jul. 5, 2016

(54) HIGH VOLTAGE DEVICE WITH COMPOSITE STRUCTURE AND A STARTING CIRCUIT

(71) Applicant: SHENZHEN SUNMOON MICROELECTRONICS CO., LTD., Shezhen, Guangdong (CN)

(72) Inventor: Zhaohua Li, Shenzhen (CN)

(73) Assignee: Shenzhen Sunmoon Microelectronics Co., Ltd., Shenzhen, Guangdong (CN)

( * ) Notice: Subject to any disclaimer, the term of this patent is extended or adjusted under 35 U.S.C. 154(b) by 146 days.

(21) Appl. No.: 14/357,492

(22) PCT Filed: Aug. 9, 2013

(86) PCT No.: PCT/CN2013/081159
§ 371 (c)(1),
(2) Date: May 9, 2014

(87) PCT Pub. No.: WO2014/082469
PCT Pub. Date: Jun. 5, 2014

(65) Prior Publication Data
US 2015/0311280 A1    Oct. 29, 2015

(30) Foreign Application Priority Data

Nov. 28, 2012   (CN) .......................... 2012 1 0492874

(51) Int. Cl.
*H02M 1/36*    (2007.01)
*H01L 29/06*   (2006.01)
(Continued)

(52) U.S. Cl.
CPC .......... *H01L 29/0623* (2013.01); *H01L 27/085* (2013.01); *H01L 29/7817* (2013.01);
(Continued)

(58) Field of Classification Search
CPC ............................... H01M 1/36; H01L 29/808
See application file for complete search history.

(56) References Cited

U.S. PATENT DOCUMENTS 6,353,251 B1 *   3/2002   Kimura ................. B82Y 10/00
                                                              257/471
7,939,863 B2 *   5/2011   Hao ................... H01L 21/76264
                                                              257/262

(Continued)

FOREIGN PATENT DOCUMENTS

| CN | 200979884 | 11/2007 |
| CN | 103000626 | 3/2013 |
| CN | 203055909 | 7/2013 |

OTHER PUBLICATIONS

Machine Translation of CN 200979884.*

*Primary Examiner* — Emily P Pham
(74) *Attorney, Agent, or Firm* — Hamre, Schumann, Mueller & Larson, P.C.

(57) ABSTRACT

A high voltage device with composite structure comprises a high voltage power MOS transistor HVNMOS and a JFET. The high voltage power MOS transistor HVNMOS comprises a drain, a source, a gate and a substrate, and a P-type well region Pwell as a conducting channel which is arranged between the source and the drain. The JFET comprises the drain, the source, the gate and the substrate, and an N-type well region Nwell as a conducting channel which is arranged between the source and the drain. The high voltage power MOS transistor HVNMOS and the JFET share the same drain, and the drain is processed by using N-type double diffusion process. The embodiment of the present invention further presents a starting circuit using the high voltage device with composite structure.

6 Claims, 4 Drawing Sheets

(51) Int. Cl.
*H01L 29/78* (2006.01)
*H01L 29/808* (2006.01)
*H01L 27/085* (2006.01)
*H03K 17/22* (2006.01)
*H01L 27/02* (2006.01)

(52) U.S. Cl.
CPC ........ *H01L29/7832* (2013.01); *H01L 29/7835* (2013.01); *H01L 29/808* (2013.01); *H02M 1/36* (2013.01); *H01L 27/0203* (2013.01); *H03K 17/22* (2013.01)

(56) References Cited

U.S. PATENT DOCUMENTS

| 2010/0230749 | A1* | 9/2010 | Chiang | H01L 21/82385 257/337 |
| 2010/0301412 | A1 | 12/2010 | Parthasarathy et al. | |
| 2011/0080213 | A1 | 4/2011 | Tang et al. | |
| 2012/0043608 | A1* | 2/2012 | Yang | H01L 29/0653 257/336 |
| 2013/0082315 | A1* | 4/2013 | Hosoda | H01L 29/66833 257/315 |

* cited by examiner

HIGH VOLTAGE DEVICE WITH COMPOSITE STRUCTURE AND A STARTING CIRCUIT

TECHNICAL FIELD

The present invention relates to the semiconductor device technical field, and more particularly, to a high voltage device with composite structure and a starting circuit.

BACKGROUND

In the field of AC/DC switching power supply applications, a starting circuit is needed to provide the required start-up voltage to the controller chip. In traditional application, The starting circuit is achieved by connecting a resistor with large resistance between the rectifier and the power terminal of the controller chip, the output terminal of the rectifier charges a bypass capacitor of the controller chip through the resistor with large resistance, when a starting voltage is reached, the controller starts, and the system begins to work properly. After the completion of the starting, the energy required by the power terminal of the controller chip is mainly provided by an auxiliary winding. In normal work period of the controller chip, the resistor in the starting circuit still consumes a certain amount of power, which seriously affects the overall efficiency of the system. One way to solve this problem is to reduce the starting current of the controller chip and increase the starting resistance. However, due to the large starting resistance, the starting current is correspondingly reduced, and the starting time is prolonged. Another way is to integrate the starting circuit into the controller chip, after the starting is completed and the system works normally, the starting circuit is closed to remove the effect on the overall efficiency of the switching power supply system from the starting circuit.

The controller chip integrates the starting circuit, the power can only be provided to the controller chip after the completion of the conversion from high voltage to low voltage, which inevitably increases the area of the chip, and how to effectively reduce the controller chip area without affecting the starting requirements of controller chip, is the key problem that the internal integrated starting circuit confronts and must be solved. To the power chip with the controller chip integrated high voltage power MOS, the problem becomes more prominent, the area of the chip is very big, which leads to an increasing cost of the chip.

In addition, the requirement of reducing power consumption for the modern switching power supply increases day by day, and a green switching power supply is necessary for all applications, which is not only referred to the handheld and battery power supply system in the past, therefore in the promise of protecting ecological environment, reducing the energy consumption of the electric power supply system and battery power supply system is indispensable. In China, it can bring more special advantages: reducing the load of coal-fired power stations. It not only requires that the control core of the power chip is with low power consumption characteristics, but also requires that the control core of the power chip has some features further reducing the power consumption of the system.

Therefore, it is necessary to put forward an effective technical solution to solve the problem existing in design of switching power supply chip in the prior art.

SUMMARY

The purpose of the present invention aims at solving at least one of the above mentioned defects, specifically at effectively saving the chip area and reducing the cost of the chip, through the composite structure of the high voltage device.

The embodiment of the present invention provides a high voltage device with composite structure comprising a high voltage power MOS transistor HVNMOS and a JFET.

The high voltage power MOS transistor HVNMOS comprises a drain, a source, a gate and a substrate, and a P-type well region Pwell as a conducting channel which is arranged between the source and the drain.

The JFET comprises the drain, the source, the gate and the substrate, and an N-type well region Nwell as a conducting channel which is arranged between the source and the drain.

The high voltage power MOS transistor HVNMOS and the JFET share the same drain (also known as drain side or drain terminal), and the drain is processed by using an N-type double diffusion process.

Furthermore, the substrate comprises a buried layer Bury P and a deep N-type well region Deep Nwell which are configured to improve the withstand voltage and reliability of the high voltage device.

The embodiment of the present invention further provides a starting circuit using the above mentioned high voltage device with composite structure, the starting circuit comprises a negative threshold switching tube, an enabling module, an anti-intrusion module and a voltage detecting module, wherein the negative threshold switching tube comprises the above mentioned high voltage device with composite structure.

The drain, source and gate of the JFET of the high voltage device with composite structure are respectively an input terminal, an output terminal and a control terminal of the negative threshold switching tube.

A high voltage input signal is connected to the input terminal of the negative threshold switching tube, the control terminal of the negative threshold switching tube is connected to an output terminal of the enabling module, an input terminal of the enabling module is connected to an output terminal of the voltage detecting module, an input terminal of the voltage detecting module and a power terminal of a chip are connected to an output terminal of the anti-intrusion module.

The high voltage input signal is connected to the negative threshold switching tube, and provides energy to the power terminal VDD of the chip through the negative threshold switching tube, the voltage detecting module detects the voltage value of the power terminal VDD of the chip, when the voltage value of the power terminal VDD reaches a predetermined operating voltage of the chip, the chip starts, meanwhile the voltage detecting module outputs an enabling signal EN.

The enabling module receives the enabling signal EN, such that the negative threshold switching tube is cut off to turn off the negative threshold switching tube.

The anti-intrusion module enables the unidirectional conduction between the input terminal of the negative threshold switching tube and the power terminal VDD of the chip, to prevent the current in the power terminal VDD from flowing back to the input terminal of the switching tube.

The above solution provided by the embodiment of the present invention, effectively saves the chip area and reduces the cost of the chip, due to the composite structure of the high voltage device. Using the composite structure of the high voltage device provided by the present invention, the starting circuit is shut down when the chip enters normal operation, which not only greatly reduces the difficulty of achieving the low power consumption system, improves the conversion efficiency of the power system, but can also effectively save the circuit components (starting resistance), and improve the integration level. In addition, the above proposed solution of the present invention, make small changes to the existing circuit system, does not affect the system's compatibility, and may be implemented simply and efficiently.

Additional aspects and advantages of the invention are partly given in the following description, and will become apparent from the following description, or be learned by the practice of the present invention.

BRIEF DESCRIPTION OF THE DRAWINGS

Additional aspects and/or advantages of the present invention will become apparent and easy to be understood from the following description of embodiments taking in conjunction with the accompanying drawings, in which.

DETAILED DESCRIPTION OF THE PREFERRED EMBODIMENTS

The embodiment of the present invention is described in detail hereafter, the sample of the embodiment is shown in the accompanying drawings, and the identical or similar reference number represents the identical or similar elements or elements with the identical or similar functions. The embodiments described hereafter with reference to the accompanying drawings are exemplary, and are only intended to illustrate but not to limit the present invention.

In the context and the accompanying drawings, P-substrate represents a P-type substrate, Pwell represents a P-type well region; Bury P represents a P-type buried layer; Deep Nwell represents a deep N-type well region; Nwell represents an N-type well region; LV Nwell represents a low voltage N-type well region; P+ represents P-type high concentration injection, N+ represents N-type high concentration injection, Sub represents the substrate, Source represents the source of the device, Drain represents the drain of the device, Gate represents the gate of the device; HVNMOS represents the high voltage power MOS transistor, JFET represents a junction field-effect transistor; J-Source represents the source of the junction field effect transistor; J-Gate represents the gate of the junction field effect transistor; LV-MOS represents a low voltage MOS device.

To realize the purpose of the present invention, the embodiment of the present invention provides a high voltage device with composite structure comprising a high voltage power MOS transistor HVNMOS and a JFET.

The high voltage power MOS transistor HVNMOS comprises a drain, a source, a gate and a substrate, and a P-type well region Pwell as a conducting channel which is arranged between the source and the drain.

The JFET comprises the drain, the source, the gate and the substrate, and an N-type well region Nwell as a conducting channel which is arranged between the source and the drain.

The high voltage power MOS transistor HVNMOS and the JFET share the same drain, and the drain is processed by using N-type double diffusion process Furthermore, the substrate comprises a buried layer Bury P and a deep N-type well region Deep Nwell which are configured to improve the withstand voltage and reliability of the high voltage device.

The high voltage power MOS transistor HVNMOS of the present invention typically refers to a power MOSFET with a withstand voltage above 700V.

The above proposed structure of the present invention is described in detail with reference to the accompanying drawings.

The present invention provides a optimized feasible device structure, according to the characteristics of the current high voltage of 700v process, taking in conjunction with the structure characteristics of a high voltage power device and a JFET device, which is applied to the small power controller chip of the switch power supply to realizes the high integration, high performance and low cost controller chip.

Figure 1:
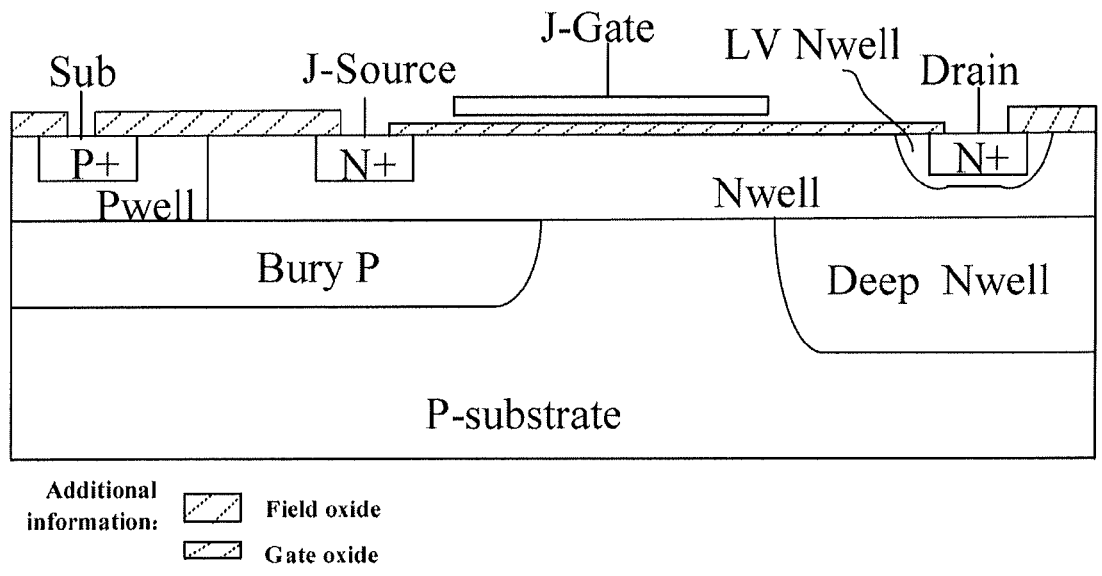
FIG. 1 is the schematic cross-section view of the high voltage power MOS transistor HVNMOS.

FIG. 1 is the schematic cross-section view of the high voltage power MOS transistor HVNMOS which comprises four ports respectively being a drain Drain, a source Source, a gate Gate, and a substrate Sub, and a P-type well region Pwell as a conducting channel which is arranged between the source and the drain. The structure of the high voltage power MOS transistor is similar to the structure of the normal low voltage power MOSFET, the difference is that the drain is processed by using the N-type double diffusion process, and a buried layer Bury P and a Deep N-type well region Deep Nwell which are configured to improve the withstand voltage and reliability of the device to reduce the affect on the device from a parasitic components are added.

The high voltage power MOS transistor HVNMOS is enhancement mode structure, namely when the voltage Vgs between the gate and source of the high-voltage power MOS HVNMOS is greater than a certain threshold, the HVNMOS is conducted, the electrons move from the source to the drain through the conducting channel to form a current; when Vgs is less than the threshold the HVNMOS is cut off.

Figure 2:
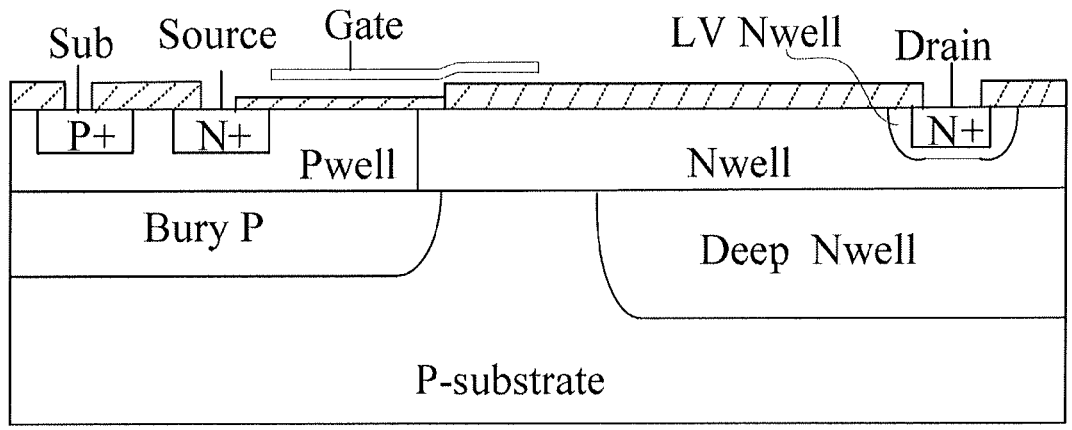
FIG. 2 is the schematic cross-section view of the high voltage starting device JFET.

FIG. 2 is the schematic cross-section view of the high voltage starting device JFET comprising four ports respectively being a drain Drain, a source Source, a gate Gate, and a substrate Sub. The structure of the JFET is similar to the structure of the high voltage power MOS transistor, also comprises a buried layer Bury P and a Deep N-type well region Deep Nwell which are configured to improve the withstand voltage and reliability of the device to reduce the affect on the device from a parasitic components. The difference is that the conducting channel is an N-type well region Nwell which is arranged between the source and the drain. When the initial voltage difference between the gate and the source is zero, the high voltage JFET is conducted; it needs a larger negative threshold voltage applied between the gate and the source to cut off the JFET.

Because the high voltage JFET has the characteristics of negative threshold shut-off and high withstand voltage, the drain and source of the JFET can be directly connected to the high voltage input signal and the middle or low voltage circuit inside the chip, which can realize integrating the starting circuit into the chip by using a simple control. The experiment has proved that this method may obtain good performance in the actual chip design and is a feasible solution.

By comparing the process structures of the high voltage JFET and the high voltage power MOS transistor HVNMOS (FIG. 1 and FIG. 2), it finds that their structures are very similar, the structures of the drains are identical, so the high voltage JFET and the high voltage power MOS transistor HVNMOS can share a drain. A high voltage JFET may be manufactured just by extending the N well below the drain of the high voltage power MOS transistor HVNMOS and meanwhile leading out the source and the gate of the JFET.

Figure 3:
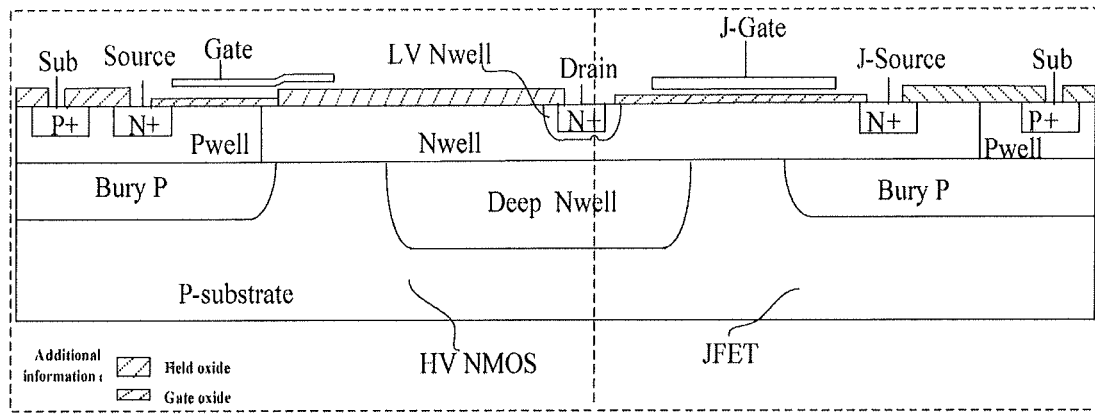
FIG. 3 is the schematic cross-section view of the composite structure of the high voltage device of the present invention.

Through the previous deep analysis, the cross-section view of the structure provided by the present invention is shown in FIG. 3, and comprises two parts. The left part is the structure of the high voltage power MOS transistor HVNMOS, the right part is the structure of JFET required by starting circuit, the left part and the right part share the drain Drain, which effectively reduces the chip area generated by the starting circuit.

In practical application, before starting the controller chip, the high voltage JFET is in conduction state, and charges the capacitor connected to the power terminal of the controller chip; while the high voltage power MOS transistor HVNMOS remains cut-off; once the controller chip reaches its starting voltage, the internal logic of the chips will cut off the high voltage JFET, whether the high voltage power MOS transistor HVNMOS is conducted or cut off is determined by the controller chip according to the operation state, thus the high voltage power MOS transistor HVNMOS and the high voltage JFET share the drain, but work without influencing each other. After the starting for the chip is completed, the starting circuit is closed, thereby removing the effect on the efficiency of the switching power supply system from the starting circuit, which facilitates improving the work efficiency of the system.

In addition, usually the conduction current of the high voltage power MOS transistor HVNMOS is larger, the layout area of the high voltage power MOS transistor HVNMOS is large, the high voltage power MOS transistor HVNMOS comprises a plurality of the high voltage power MOS transistors HVNMOS connected in parallel, because the high voltage power MOS transistors share the drain, the area of the JFET may be large, thus the starting circuit provides a large current, the controller chip may be started quickly.

Figure 4:
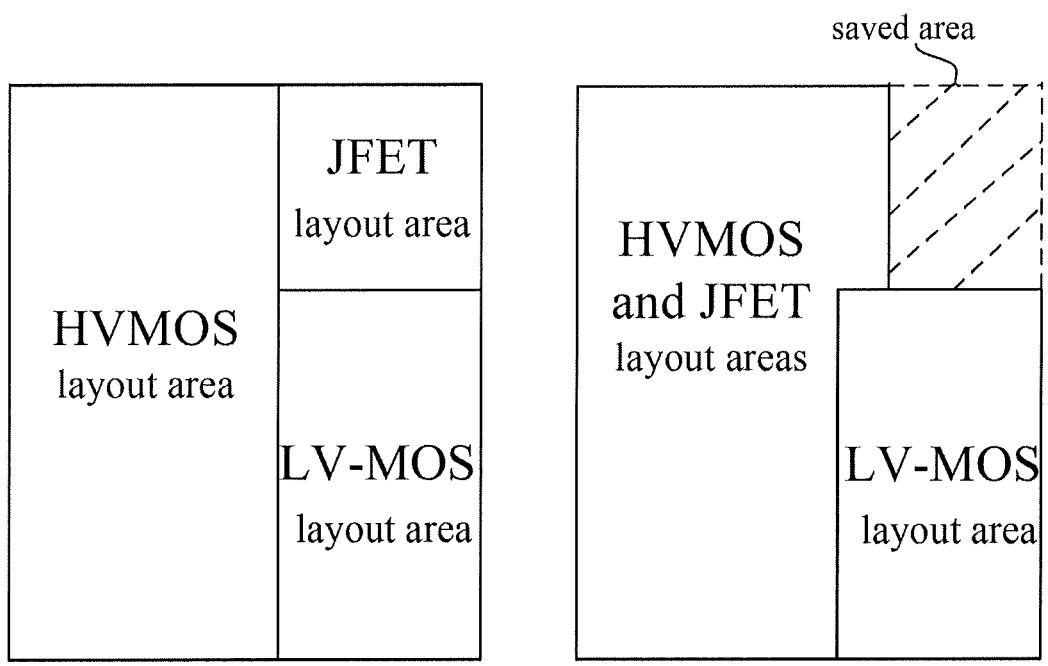
FIG. 4 is the comparing diagram of the chip layout areas before and after using the structure.

FIG. 4 shows the comparing diagram of the chip layout areas before and after using the structure, if the areas of the high voltage power MOS transistor HVNMOS and the low voltage module (referred to LV-MOS for short) remain the same, the structure provided by the present invention greatly reduce the area of the starting circuit (i.e., the shadow area), effectively save the chip area. Today the chip with high performance, high integration, low-cost is pursued, and reducing the chip area is an important factor to reduce the chip cost.

The embodiment of the present invention further presents a starting circuit using the above mentioned high voltage device with composite structure, the starting circuit comprises a negative threshold switching tube, an enabling module, an anti-intrusion module and a voltage detecting module, wherein the negative threshold switching tube comprises the above mentioned high voltage device with composite structure.

The drain, source and gate of the JFET of the high voltage device with composite structure are respectively an input terminal, an output terminal and a control terminal of the negative threshold switching tube.

A high voltage input signal is connected to the input terminal of the negative threshold switching tube, the control terminal of the negative threshold switching tube is connected to an output terminal of the enabling module, an input terminal of the enabling module is connected to an output terminal of the voltage detecting module, an input terminal of the voltage detecting module and a power terminal of a chip are connected to an output terminal of the anti-intrusion module.

The high voltage input terminal of the starting circuit provides energy to the power terminal VDD of the chip through the negative threshold switching tube, the voltage detecting module detects the voltage value of the power terminal VDD of the chip, when the voltage value of the power terminal VDD reaches a pre-determined operating voltage of the chip, the chip is started, meanwhile the voltage detecting module outputs an enabling signal EN.

The enabling module receives the enabling signal EN, such that the negative threshold switching tube is cut off to turn off the negative threshold switching tube.

The anti-intrusion module enables the unidirectional conduction between the input terminal of the negative threshold switching tube and the power terminal VDD of the chip.

Figure 5:
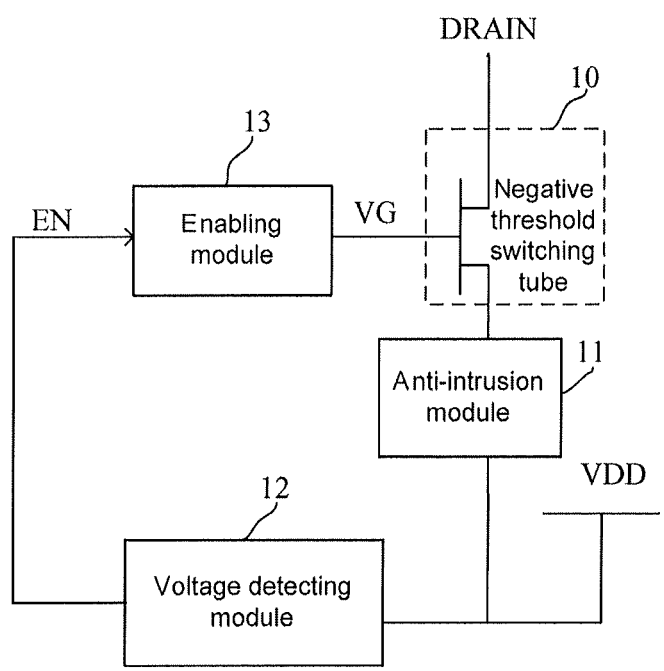
FIG. 5 is the function block diagram of the starting circuit of the present invention.

What's shown in FIG. 5 is the function block diagram of the starting circuit of the present invention. The circuit of the present invention comprises a negative threshold switching tube 10, an enabling module 13, an anti-intrusion module 11 and a voltage detecting module 12. The high voltage input signal provides energy to the power terminal VDD of the chip through the negative threshold switching tube 10, the voltage detecting module 12 detects the voltage value of the power terminal VDD of the chip, when the voltage value of the power terminal VDD reaches a pre-determined operating voltage of the chip, the chip is started, meanwhile the voltage detecting module 12 outputs an enabling signal EN.

The enabling module 13 receives the enabling signal EN, such that the negative threshold switching tube is cut off to turn off the negative threshold switching tube 10.

The anti-intrusion module 11 enables the unidirectional conduction between the input terminal of the negative threshold switching tube and the power terminal VDD of the chip. When the voltage of the input terminal of the negative threshold switching tube 10 reduces, the current in the power terminal VDD is prevented from flowing back to the input terminal of the negative threshold switching tube.

Figure 6:
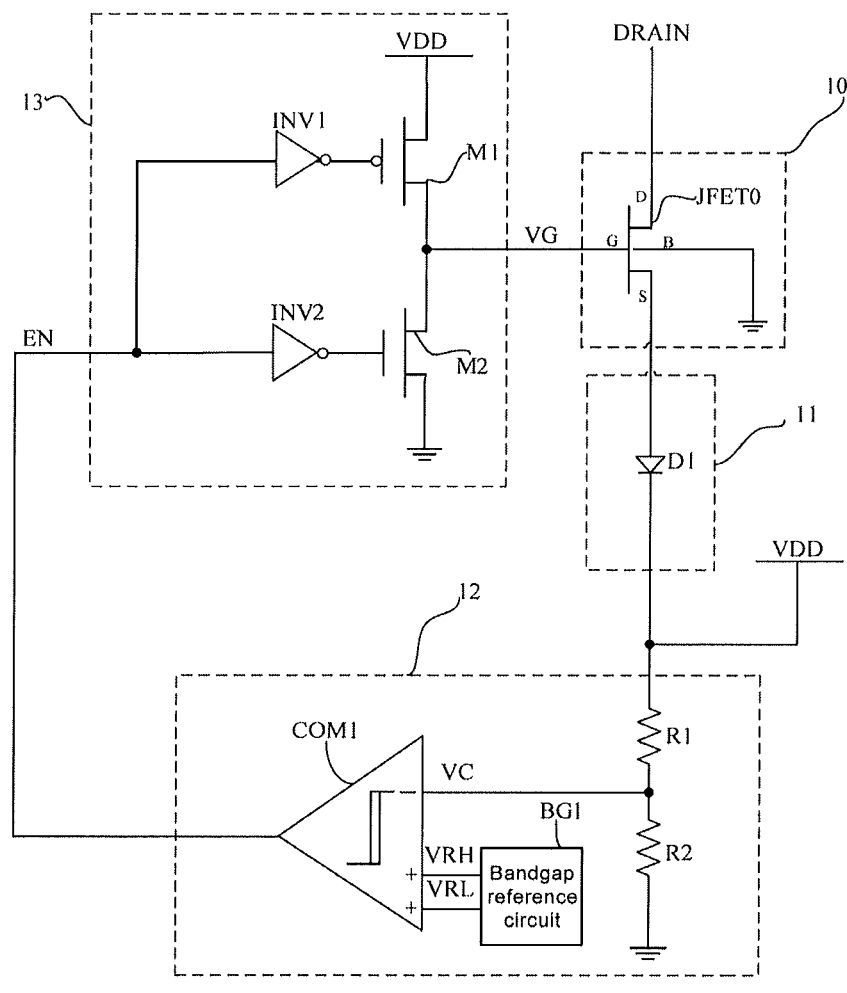
FIG. 6 is the schematic circuit diagram of the specific starting circuit of the present invention.

Furthermore, FIG. 6 is an example of a specific circuit implementation of the present invention, the negative threshold switching tube 10 comprises a JFET JFET0. The high voltage signal is connected to the drain D of the JFET0, the source S of the JFET JFET0 is connected to the input terminal of the anti-intrusion module, the gate G of the JFET JFET0 is connected to the output terminal VG of the enabling module 13.

The anti-intrusion module 11 comprises a diode D1, the anode of the diode D1 is the input terminal of the anti-intrusion module 11, the cathode of the diode D1 is the output terminal of the anti-intrusion module 11 which is connected to the power terminal VDD of the controller chip and the input terminal of the voltage detecting module 12.

The voltage detecting module 12 comprises resistors R1, R2, a hysteresis comparator COM1 and a bandgap reference circuit BG1. The input terminal of the voltage detecting module 12 is the power terminal VDD of the controller chip which is connected to a first terminal of the resistor R1, a second terminal of the resistor R1 and a first terminal of the resistor R2 are connected to an inverse terminal VC of the hysteresis comparator COM1, a second terminal of the resistor R2 is connected to the ground. The voltage of a first positive reference terminal VRH and a second positive reference terminal VRL of the hysteresis comparator COM1 may be generated by the bandgap reference circuit. The output terminal of the hysteresis comparator COM1 is the output terminal of the voltage detecting module 12 outputting the enabling signal EN.

The enabling module 13 comprises phase inverters INV1, INV2, a PMOS transistor M1 and a NMOS transistor M2. The input terminal of the phase inverter INV1 is connected to the input terminal of the phase inverter INV2 to serve as the input terminal of the enabling module 13 which is connected to the output terminal of the voltage detecting module 12. The output terminal of the phase inverter INV1 is connected to the gate of the PMOS transistor M1, the source of the PMOS transistor M1 is connected to the power terminal of the controller chip, the drain of the PMOS transistor M1 and the drain of the NMOS transistor M2 which serve as the output terminal of the enabling module are connected to the gate G of the JFET JFET0. The output terminal of the phase inverter INV2 is connected to the gate of the NMOS transistor M2, the source of the NMOS transistor M2 is connected to the ground.

At the beginning of the starting for the controller chip, the value of the voltage of the power terminal VDD of the chip is zero, the resistors R1, R2 and a voltage comparator form the voltage detecting module 12 for detecting supply voltage of the chip. When the chip is just powered on, because the threshold of the negative threshold switching tube is negative, the JFET JFET0 is conducted; the voltage of VDD increases and the voltage VC shown in the figure also increase. When VC is larger than VRH, the hysteresis comparator outputs the enabling single EN that transfers from high level to low level, the enabling single EN turns on the NMOS transistor M2 and turns off the PMOS transistor M1 respectively through the phase inverter INV1 and INV2, then the voltage of the gate of the JFET JFET0 is lowered and then is turned off, at that moment the voltage of the gate of the negative threshold switching tube is negative and the negative threshold switching tube is turned off. And the JFET JFET0 and high voltage power MOS transistor (HVNMOS) share the drain, when the high voltage power MOS transistor (HVNMOS) serves as the switching device of the controller chip, the voltage of the drain sometimes generates an transition between high level and low level. In order to prevent the current VDD from flowing back to the drain D of the JFET JFET0 in the time when the voltage of the drain of the JFET JFET0 reduces, the anti-intrusion module is added into the circuit, when the voltage of the drain of the JFET JFET0 reduces, the current of the power terminal VDD is prevented from flowing back to the drain D of the JFET JFET0 to achieve the unidirectional conduction.

Obviously, in the above specific circuit, the negative threshold switching tube comprises but is not limited to an N-type device with a negative threshold voltage such as depletion mode field effect transistor, junction field effect transistor and so on; the voltage detecting module is implemented by, but not limited to the circuit using a voltage divided resistor and the voltage comparator; the enabling modules is implemented by, but not limited to the circuit using the phase inverter and the MOS transistor, it is OK as long as the gate-source voltage may become negative to turn off the negative threshold switching tube.

The above solution provided by the present invention, by introducing the negative threshold switching tube into the starting circuit, the starting current flows into the starting circuit only during the starting of starting circuit, the starting circuit is shut down when the chip enters normal operation, which not only greatly reduces the difficulty of achieving the low power consumption system, improves the conversion efficiency of the power system, but can also effectively save the circuit components (starting resistance). In addition, the above proposed solution of the present invention, make small changes to the existing circuit system, does not affect the system's compatibility, and may be implemented simply and efficiently.

Though the exemplary embodiments and advantages thereof have been described in detail, it should be understood that the various modifications, replacements and improvements for the embodiment may be made without separating from the spirit of the present invention and the protection scope limited by the appended claims. For other examples, the ordinary technicians in the art should be easy to understand that, while maintaining the protection scope of the invention, the sequence of process steps can be varied.

Moreover, the scope of the application of the present invention is not limited to the particular embodiments of the process, mechanisms, manufacture, composition of matter, means, methods and steps described in the specification. As one of the ordinary technicians in the art will readily appreciate from the disclosure of the present invention that the processes, mechanisms, manufacture, compositions of matter, means, methods, or steps, presently existing or later to be developed that perform substantially the same function or achieve substantially the same result as the corresponding embodiments described herein may be utilized according to the present invention.

Accordingly, the appended claims are intended to include such processes, machines, manufacture, compositions of matter, means, methods, or steps in the protection scope. It should be noted that, the ordinary technicians in the art can make some improvements and retouching without separating from the principle of the present invention, these improvements and polishing shall also be in the protection scope of the present invention.

What is claimed is:

1. A starting circuit, comprising:
a negative threshold switching tube,
an enabling module,
an anti-intrusion module, and
a voltage detecting module,
wherein the negative threshold switching tube comprises: a
  high voltage device with composite structure that comprises:
    a high voltage power MOS transistor HVNMOS, and
    a JFET,
  a drain, a source and a gate of the JFET of the high voltage device with composite structure are respectively an input terminal, an output terminal and a control terminal of the negative threshold switching tube;
a high voltage input signal is connected to the input terminal of the negative threshold switching tube, the control terminal of the negative threshold switching tube is connected to an output terminal of the enabling module, an input terminal of the enabling module is connected to an output terminal of the voltage detecting module, an input terminal of the voltage detecting module and a power terminal of a chip are connected to an output terminal of the anti-intrusion module, the high voltage input signal is connected to the negative threshold switching tube, and provides energy to power terminal of the chip through the negative threshold switching tube, the voltage detecting module detects the voltage value of the power terminal of the chip, when the voltage value of the power terminal reaches a pre-determined operating voltage of the chip, the chip starts, meanwhile the voltage detecting module outputs an enabling signal;
the enabling module receives the enabling signal, such that the negative threshold switching tube is cut off to turn off the negative threshold switching tube;
the anti-intrusion module enables the unidirectional conduction between the input terminal of the negative threshold switching tube and the power terminal of the chip, to prevent the current in the power terminal from flowing back to the input terminal of the negative threshold switching tube.

2. The starting circuit of claim 1, wherein the anti-intrusion module comprises a diode D1, the anode of the diode D1 is the input terminal of the anti-intrusion module, the cathode of the diode D1 is the output terminal of the anti-intrusion module.

3. The starting circuit of claim 1, wherein the voltage detecting module comprises resistors R1, R2, a hysteresis comparator and a bandgap reference circuit, the input terminal of the voltage detecting module is connected to a first terminal the resistor R1, a second terminal of the resistor R1 and a first terminal of the resistor R2 are connected to an inverse terminal of the hysteresis comparator, a second terminal of the resistor R2 is connected to the ground, the voltage of a first positive reference terminal and a second positive reference terminal of the hysteresis comparator is generated by the bandgap reference circuit, the output terminal of the hysteresis comparator is the output terminal of the voltage detecting module outputting the enabling signal.

4. The starting circuit of claim 1, wherein the enabling module comprises phase inverters INV1, INV2, a PMOS transistor M1 and a NMOS transistor M2; the input terminal of the phase inverter INV1 is connected to the input terminal of the phase inverter INV2 to serve as the input terminal of the enabling module, the output terminal of the phase inverter INV1 is connected to the gate of the PMOS transistor M1, the source of the PMOS transistor M1 is connected to the power terminal of the chip, the drain of the PMOS transistor M1 and the drain of the NMOS transistor M2 which serve as the output terminal of the enabling module are connected to the gate of the JFET, the output terminal of the phase inverter INV2 is connected to the gate of the NMOS transistor M2, the source of the NMOS transistor M2 is connected to the ground.

5. The starting circuit of claim 1, wherein the high voltage power MOS transistor HVNMOS comprises:
   a drain,
   a source,
   a gate,
   a substrate, and
   a P-type well region Pwell as a conducting channel which is arranged between the source and the drain,
   wherein the JFET comprises:
   the drain,
   the source,
   the gate,
   the substrate, and
   an N-type well region Nwell as a conducting channel which is arranged between the source and the drain, and
   wherein the high voltage power MOS transistor HVNMOS and the JFET share the same drain, and the drain is processed by using N-type double diffusion process.

6. The starting circuit of claim 5, wherein the substrate comprises a buried layer and a deep N-type well region which are configured to improve the withstand voltage and reliability of the high voltage device.

* * * * *